US012790431B2

(12) United States Patent
Wright

(10) Patent No.: US 12,790,431 B2
(45) Date of Patent: Nov. 10, 2026

(54) METHODS FOR THE RAPID PRODUCTION OF BLOCKED PREPOLYMERS

(71) Applicant: CARBON, INC., Redwood City, CA (US)

(72) Inventor: Andrew Gordon Wright, Mountain View, CA (US)

(73) Assignee: Carbon, Inc., Redwood City, CA (US)

( * ) Notice: Subject to any disclaimer, the term of this patent is extended or adjusted under 35 U.S.C. 154(b) by 408 days.

(21) Appl. No.: 18/562,951

(22) PCT Filed: Jun. 3, 2022

(86) PCT No.: PCT/US2022/032135
§ 371 (c)(1),
(2) Date: Nov. 21, 2023

(87) PCT Pub. No.: WO2022/256635
PCT Pub. Date: Dec. 8, 2022

(65) Prior Publication Data
US 2024/0239948 A1 Jul. 18, 2024

Related U.S. Application Data

(60) Provisional application No. 63/196,241, filed on Jun. 3, 2021.

(51) Int. Cl.

| | |
|---|---|
| ***C08G 18/80*** | (2006.01) |
| ***B29C 64/124*** | (2017.01) |
| ***B33Y 70/00*** | (2020.01) |
| ***C08F 283/00*** | (2006.01) |
| ***C08F 290/06*** | (2006.01) |
| ***C08G 18/10*** | (2006.01) |
| ***C08G 18/24*** | (2006.01) |
| ***C08G 18/48*** | (2006.01) |
| ***C08G 18/72*** | (2006.01) |
| ***C08G 18/75*** | (2006.01) |
| ***C08G 18/81*** | (2006.01) |
| ***G03F 7/00*** | (2006.01) |
| ***G03F 7/035*** | (2006.01) |

(52) U.S. Cl.
CPC ............ *C08G 18/808* (2013.01); *B33Y 70/00* (2014.12); *C08F 283/006* (2013.01); *C08F 290/067* (2013.01); *C08G 18/10* (2013.01); *C08G 18/24* (2013.01); *C08G 18/244* (2013.01); *C08G 18/4825* (2013.01); *C08G 18/4854* (2013.01); *C08G 18/72* (2013.01); *C08G 18/755* (2013.01); *C08G 18/758* (2013.01); *C08G 18/8067* (2013.01); *C08G 18/8175* (2013.01); *G03F 7/0037* (2013.01); *G03F 7/035* (2013.01); *B29C 64/124* (2017.08)

(58) Field of Classification Search
CPC ...... C08G 18/808; C08G 18/10; C08G 18/24; C08G 18/244; C08G 18/4825; C08G 18/72; C08G 18/758; C08G 18/8067; C08G 18/4854; C08G 18/755; C08G 18/8175; B29C 64/124; B33Y 70/00; C08F 283/006; C08F 290/067; G03F 7/0037; G03F 7/035
See application file for complete search history.

(56) References Cited

U.S. PATENT DOCUMENTS

| | | | |
|---|---|---|---|
| 3,213,058 | A | 10/1965 | Boyle et al. |
| 3,286,992 | A | 11/1966 | Armeniades et al. |
| 3,945,622 | A | 3/1976 | Sokolow |
| 5,080,493 | A | 1/1992 | McKown et al. |
| 5,249,862 | A | 10/1993 | Herold et al. |
| 6,861,475 | B2 | 3/2005 | Ilenda et al. |
| 6,916,867 | B2 | 7/2005 | Gugumus |
| 7,157,586 | B2 | 1/2007 | Wood et al. |
| 7,625,977 | B2 | 12/2009 | Lutz et al. |
| 7,642,316 | B2 | 1/2010 | Rego et al. |
| 7,695,643 | B2 | 4/2010 | Fritzsche et al. |
| 7,820,760 | B2 | 10/2010 | Pham et al. |
| 8,088,245 | B2 | 1/2012 | Lutz et al. |
| 8,651,731 | B2 | 2/2014 | Wintergerste et al. |
| 8,734,609 | B2 | 5/2014 | Duffy |
| 9,006,375 | B2 | 4/2015 | Doyle et al. |
| 9,205,601 | B2 | 12/2015 | Desimone et al. |
| 9,211,678 | B2 | 12/2015 | Desimone et al. |
| 9,216,546 | B2 | 12/2015 | Desimone et al. |

(Continued)

FOREIGN PATENT DOCUMENTS

| | | | |
|---|---|---|---|
| EP | 1632533 | A1 | 3/2006 |
| EP | 2123711 | A1 | 11/2009 |

(Continued)

OTHER PUBLICATIONS

International Search Report and Written Opinion corresponding to PCT/US2022/032135; Date of Mailing: Oct. 4, 2022 (18 pages).

(Continued)

*Primary Examiner* — Rabon A Sergent
(74) *Attorney, Agent, or Firm* — Myers Bigel, P.A.

(57) ABSTRACT

Provided according to embodiments of the invention are methods for the rapid production of a composition that includes a reactive blocked prepolymer. Such methods may include continuously mixing a first precursor composition and a second precursor composition, the first precursor composition including a polyisocyanate oligomer and the second precursor composition including an amine (meth) acrylate to produce the composition that includes a reactive blocked prepolymer.

20 Claims, 1 Drawing Sheet

(56) References Cited

U.S. PATENT DOCUMENTS

| | | | |
|---|---|---|---|
| 9,453,142 | B2 | 9/2016 | Rolland et al. |
| 9,598,606 | B2 | 3/2017 | Rolland et al. |
| 9,656,224 | B2 | 5/2017 | Linne et al. |
| 9,676,963 | B2 | 6/2017 | Rolland et al. |
| 9,782,947 | B2 | 10/2017 | Gunzel et al. |
| 10,184,042 | B2 | 1/2019 | Doyle |
| 10,208,227 | B2 | 2/2019 | King et al. |
| 10,549,246 | B2 | 2/2020 | Merrigan et al. |
| 10,577,450 | B2 | 3/2020 | Doyle |
| 2007/0027233 | A1 | 2/2007 | Yamaguchi et al. |
| 2010/0280151 | A1 | 11/2010 | Nguyen et al. |
| 2013/0032375 | A1 | 2/2013 | Georlette et al. |
| 2015/0184039 | A1 | 7/2015 | Lutz et al. |
| 2015/0240113 | A1 | 8/2015 | Pratt et al. |
| 2020/0377745 | A1 | 12/2020 | Drazba et al. |

FOREIGN PATENT DOCUMENTS

| | | | | |
|---|---|---|---|---|
| WO | WO-2017112653 | A1 * | 6/2017 | ............... G03F 7/40 |
| WO | 2020249060 | A1 | 12/2020 | |
| WO | 2021004383 | A1 | 1/2021 | |
| WO | 2021173785 | A1 | 9/2021 | |

OTHER PUBLICATIONS

Tumbleston, John R., et al., "Continuous liquid interface production of 3D Objects", Science, 347(6228), 2015, 1349-1352.

* cited by examiner

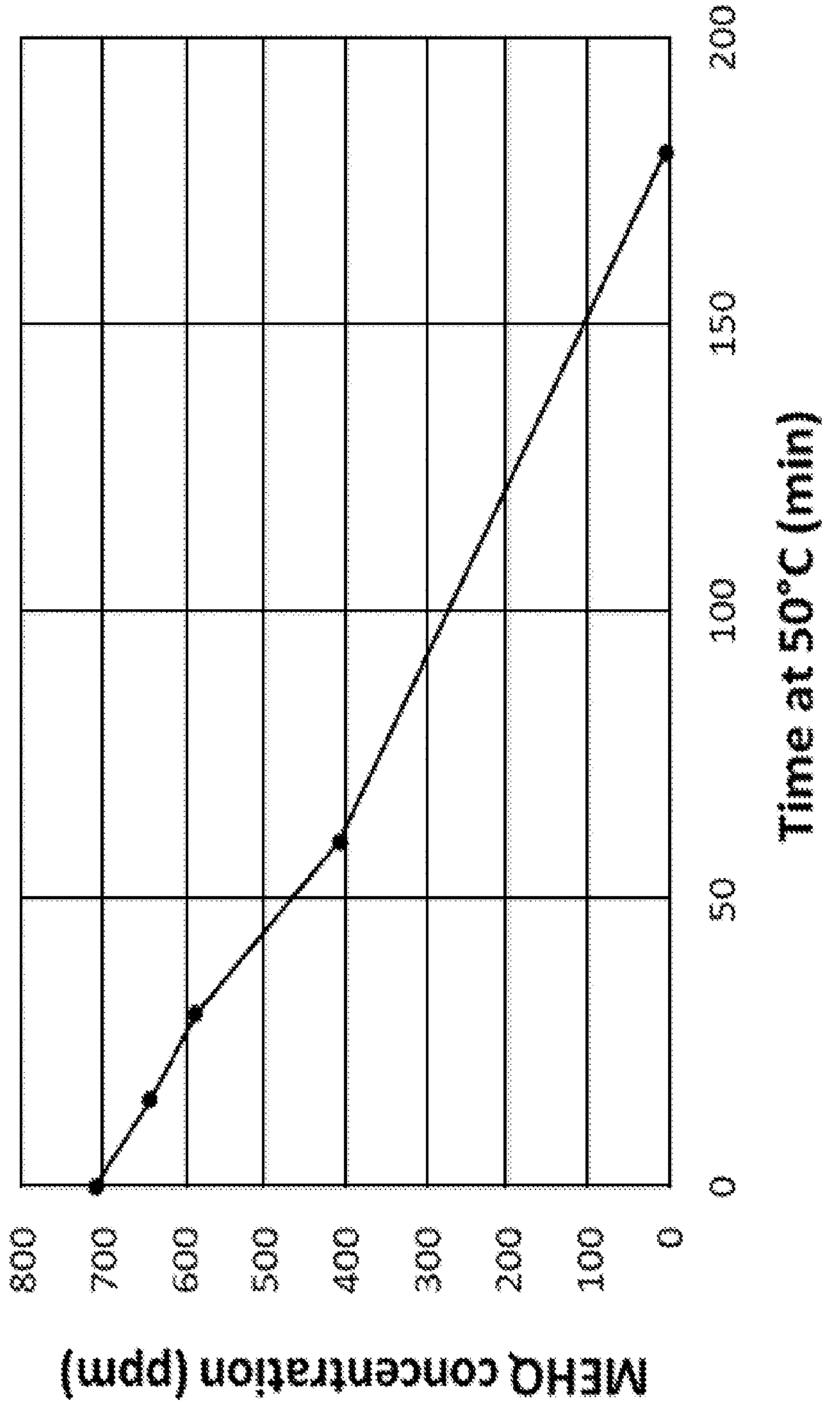
MEHQ concentration (ppm)
800
700
600
500
400
300
200
100
0
Time at 50°C (min)
0
50
100
150
200

METHODS FOR THE RAPID PRODUCTION OF BLOCKED PREPOLYMERS

CROSS REFERENCE TO RELATED APPLICATIONS

This application is a 35 U.S.C. § 371 national phase application of International Application Serial No. PCT/US2022/032135, filed Jun. 3, 2022, which claims the benefit of and priority to U.S. Provisional Application Ser. No. 63/196,241, filed on Jun. 3, 2021, the disclosure of which is hereby incorporated by reference herein it its entirety.

FIELD OF THE INVENTION

The present invention concerns methods of making blocked prepolymers, which prepolymers are in turn useful for the production of additive manufacturing resins.

BACKGROUND OF THE INVENTION

A group of additive manufacturing techniques sometimes referred to as "stereolithography" creates a three-dimensional object by the sequential polymerization of a light polymerizable resin. Such techniques may be "bottom-up" techniques, where light is projected into the resin on the bottom of the growing object through a light transmissive window, or "top down" techniques, where light is projected onto the resin on top of the growing object, which is then immersed downward into the pool of resin.

The recent introduction of a more rapid stereolithography technique known as continuous liquid interface production (CLIP), coupled with the introduction of "dual cure" resins for additive manufacturing, has expanded the usefulness of stereolithography from prototyping to manufacturing (see, e.g., U.S. Pat. Nos. 9,211,678, 9,205,601, 9,216,546, 9,676,963, and 9,598,606; and J. Tumbleston, D. Shirvanyants, N. Ermoshkin et al., Continuous Liquid Interface Production of 3D Objects, *Science* 347, 1349-1352, 2015).

One family of dual cure resins for additive manufacturing contains reactive blocked polyurethane prepolymers (see, e.g., U.S. Pat. No. 9,453,142). The production of such prepolymers is, however, complicated. In general, a prepolymer (e.g., an oligomer) having free isocyanates is first produced in a reaction mixture at temperatures of about 60-70° C. The temperature of the reaction mixture is then reduced to about 35-50° C. and a blocking agent such as tert-butylaminoethyl methacrylate (TBAEMA) is added to block the free isocyanate groups. The temperature is lowered because the blocking groups deblock at temperatures above about 50° C., leaving free isocyanates. While satisfactory for the production of smaller quantities of (meth)acrylate blocked polyurethanes (ABPUs), it may be difficult to scale to larger, commercial-sized batches because, as the batch sizes become larger, mixing speed/times will generally increase to better homogenize the large mixtures. But this, in turn, may result in significant problems with both heat transfer and foaming. Since the temperatures are relatively low (35-50° C.), the reaction mixture viscosities may become relatively high and defoaming times may significantly increase. Additionally, to control the reaction temperatures at such scales, TBAEMA addition times may become lengthy (e.g., 1 to 16 hours), followed by potentially lengthy defoaming times (which may also take 16+ hours). Due to the blocking group-isocyanate equilibrium, the reaction speed may increase at lower temperatures, whereas higher temperatures are preferred for reducing viscosity. Additionally, longer reaction times can produce discoloration and inhibitor consumption.

Accordingly, new approaches for the production of blocked prepolymers would be useful.

SUMMARY OF THE INVENTION

In the present invention, continuous feed, rather than batch mixing processes, are employed to produced blocked prepolymers, such as ABPUs, in some embodiments with higher reaction rates, reduced discoloration, and/or controlled inhibitor levels.

Accordingly, provided according to some embodiments of the invention is a method for the production (e.g., rapid production) of a composition comprising a reactive blocked prepolymer, the method comprising: continuously mixing a first precursor composition and a second precursor composition, the first precursor composition comprising, consisting essentially of, or consisting of a polyisocyanate oligomer, and the second precursor composition comprising an amine (meth)acrylate to produce said composition comprising a reactive blocked prepolymer. In some embodiments, the continuous mixing occurs at a temperature of from 0° C. or 10° C. to 30° C., 40° C., 50° C., 60° C., 70° C., or 80° C.

In some embodiments, the continuous mixing step is carried out with a static mixer, a dynamic mixer, a mix meter dispense (MMD) apparatus, or a combination thereof. In some embodiments, the static, dynamic, and/or MMD mixer is operatively associated with a temperature controller (e.g., for heating and/or cooling the composition therein).

In some embodiments, the mixing is carried out under conditions which produce said composition comprising a reactive blocked prepolymer in a time of not more than 6 or 8 hours.

In some embodiments, the amine (meth)acrylate includes one or more of tert-butylaminoethyl methacrylate (TBAEMA), tert-pentylaminoethyl methacrylate (TPAEMA), tert-hexylaminoethyl methacrylate (THAEMA), tert-butylaminopropyl methacrylate (TBAPMA), acrylate analogs thereof, and mixtures thereof.

In some embodiments, one of said precursor compositions is heated and/or the other of said precursor compositions is cooled (e.g., said first precursor composition is heated, e.g., to about 50° C., 60° C., or 70° C., and said second precursor composition is cooled, e.g., to about 25° C. or less) prior to and/or during the mixing.

In some embodiments, the first precursor composition includes not more than 1% by weight of monomeric diisocyanate. In other embodiments, the first precursor composition includes at least 1% by weight of monomeric diisocyanate.

In some embodiments, the first precursor composition includes not more than 1000 parts per million (ppm) water.

In some embodiments, the first and/or second precursor composition further comprises at least one diluent (e.g., lauryl methacrylate) and/or at least one polymerization inhibitor (e.g., MEHQ (monomethyl ether hydroquinone), PTZ (phenothiazine), etc.).

In some embodiments, the composition comprising a reactive blocked preopolymer contains not more than 1000 ppm of polyisocyanate oligomer in unblocked form. In other embodiments, the composition comprising a reactive blocked prepolymer contains at least 1000 ppm of polyisocyanate oligomer in unblocked form, and optionally up to 50% of said polyisocyanate oligomer remaining in unblocked form.

In some embodiments, the composition comprising a reactive blocked prepolymer contains not more than 1% by weight of monomeric diisocyanate.

In some embodiments, the first precursor composition and/or the second precursor composition is filtered before said continuous mixing step (e.g., by positioning a filter in front of said mixer for the first and/or second precursor composition).

In some embodiments, the second precursor composition further comprises at least one additional constituent such as a photoabsorber, pigment, dye, matting agent, flame-retardant, filler, catalyst, non-reactive and light-reactive diluent (e.g., monomeric and/or polymeric acrylate and/or methacrylate diluent), and combinations thereof.

In some embodiments, at least one light reactive diluent is present in the composition and comprises poly(ethylene glycol) dimethacrylate, isobornyl methacrylate, lauryl methacrylate, trimethylolpropane trimethacrylate, acrylate analogs thereof, or a combination of any thereof.

The foregoing and other objects and aspects of the present invention are explained in greater detail in the specification set forth below. The disclosures of all United States patent references cited herein are to be incorporated herein by reference.

BRIEF DESCRIPTION OF THE FIGURES

FIG. 1 is a graph showing the decrease in concentration of a MEHQ inhibitor over time at 50° C. in the presence of an isophorone diisocyanate (IPDI) and a tin catalyst.

DETAILED DESCRIPTION OF ILLUSTRATIVE EMBODIMENTS

The present invention is now described more fully hereinafter. This invention may, however, be embodied in many different forms and should not be construed as limited to the embodiments set forth herein: rather, these embodiments are provided so that this disclosure will be thorough and complete and will fully convey the scope of the invention to those skilled in the art.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements, components and/or groups or combinations thereof, but do not preclude the presence or addition of one or more other features, integers, steps, operations, elements, components and/or groups or combinations thereof.

As used herein, the term "and/or" includes any and all possible combinations of one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly-used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present invention. The sequence of operations (or steps) is not limited to the order presented in the claims or figures unless specifically indicated otherwise.

The transitional phrase "consisting essentially of" means that the scope of a claim is to be interpreted to encompass the specified materials or steps recited, and also additional materials or steps that do not materially affect the basic and novel characteristics of the claimed invention as described herein.

1. Resins and Precursor Compositions

The present invention provides methods of producing compositions comprising a reactive blocked prepolymer, which, in turn, may be useful as a resin for a dual cure stereolithography method, such as a method described in U.S. Pat. Nos. 9,453,142 and 9,598,606.

Polyisocyanate oligomers, sometimes also referred to as isocyanate-terminated prepolymers, are known and described in, for example, U.S. Pat. Nos. 10,577,450; 10,208,227: 10,184,042: and 9,006,375 (all assigned to Lanxess AG). Suitable examples include, but are not limited to, commercially available ADIPRENE™ prepolymers (available from Lanxess Solutions US Inc.). The polyisocyanate oligomers may be provided in a first precursor composition that is to be mixed with one or more isocyanate blocking agents as taught herein.

In some embodiments, the polyisocyanate oligomer includes two or more polyiisocyanate compounds (e.g., 2, 3, 4 or more isocyanate groups) chain extended with a polyol (e.g., 2, 3, 4, or more hydroxyl groups), a polyamine (e.g., 2, 3, 4, or more amino groups), or an amino alcohol (e.g., with 1, 2, 3 or more hydroxyl groups and 1, 2, 3, or more amino groups) such that upon during chain extension, the hydroxyl and/or amino groups react with isocyanate groups to form a urethane or urea linkage. In some embodiments, additional polyisocyanate compounds may further extend the chain. In some embodiments, the polyisocyanate oligomer includes two, three, four, five, six or more polyisocyanate compounds chain extended with polyol, polyamine and/or amino alcohol compound(s).

The polyisocyanate compounds may include any of the suitable isocyanate groups known in the art including, but not limited to, isophorone diisocyanate (IPDI), diphenylmethane diisocyanate (MDI), polymeric MDI, toluene diisocyanate (TDI), paraphenylene diisocyanate (PPDI), diphenyl 4,4'-diisocyanate ("DPDI"), dibenzyl-4,4'-diisocyanate, naphthalene diisocyanate (NDI), benzophenone-4,4'-diisocyanate, 1,3 and 1,4-xylene diisocyanates, tetramethylxylylene diisocyanate (TMXDI), 1,6-hexane diisocyanate (HDI), 3,3'-bitoluene diisocyanate (TODI), 1,4-cyclohexyl diisocyanate (CHDI), 1,3-cyclohexyl diisocyanate, and methylene bis(p-cyclohexyl isocyanate) (H12MDI).

Suitable polyol compounds are also known and include, but are not limited to, alkane polyols, polyether polyols, polyester polyols, polycaprolactone polyols and/or polycarbonate polyols. Particular examples include glycols such as ethylene glycol, propylene glycol, butane diol, pentanediol, hexanediol, trimethylolpropane, pentaerythritol, diethylene glycol, triethylene glycol, dipropylene glycol, tripropylene glycol, isomers of any of the foregoing, combinations of any of the foregoing, etc. Particular polyether polyols include poly (tetramethylene) oxide (PTMO), polyethylene oxide (PEO), and the like.

Suitable polyamine and amino alcohol compounds are also known in the art at include the amine or amino alcohol analogs to the polyol compounds described above (e.g., pentanediamine, hexanediamine, aminopentanol, aminohexanol, and the like).

In some embodiments, the polyisocyanate oligomer has a molecular weight (Mw) in a range of 250 Daltons to 7000 Daltons, including 250 Daltons, 500 Daltons, 1000 Daltons, 2000 Daltons, 3000 Daltons, 4000 Daltons, 5000 Daltons, 6000 Daltons, and 7000 Daltons and any molecular weight range defined therebetween.

In some embodiments, the first precursor composition includes not more than 1% by weight of monomeric diisocyanate. As used herein, monomeric isocyanate refers to a diisocyanate that has not been chain extended with a polyol or further polymerized (ie. dimerization, trimerization, etc.). In other embodiments, the first precursor composition includes at least 1% by weight of monomeric diisocyanate, which may be useful to include in the composition in some applications. In some embodiments, the first precursor composition includes between 1% to 50% of monomeric diisocyanate (e.g., 1%, 5%, 10%, 15%, 20%, 25%, 30%, 35%, 40%, 45%, 50%, or any concentration range defined therebetween).

In some embodiments, the first precursor composition includes not more than 1000 ppm water.

Examples of suitable amine (meth)acrylate agents for blocking polyisocyanate oligomers are secondary alkyl (sec-alkyl) amine-containing (meth)acrylates or tertiaryalkyl (tert-alkyl) amine-containing (meth)acrylates, which include, but are not limited to, t-butylaminoethyl methacrylate (TBAEMA), tertiary pentylaminoethyl methacrylate (TPAEMA), tertiary hexylaminoethyl methacrylate (THAEMA), tertiary butylaminopropyl methacrylate (TBAPMA), acrylate analogs thereof, isomers thereof, and mixtures thereof. In some embodiments, the blocking agent is provided in a second precursor composition.

In some embodiments, the first precursor composition and/or second precursor composition may further comprise at least one diluent (e.g., lauryl methacrylate) and/or at least one polymerization inhibitor such as, for example, MEHQ (monomethyl ether hydroquinone), PTZ (phenothiazine), BHT (butylated hydroxytoluene or 2,6-di-tert-butyl-4-methylphenol), hydroquinone, and antioxidants (e.g., those sold under the Irganox® brand).

In some embodiments, the first precursor composition and/or second precursor composition may further comprise at least one additional constituent including photoabsorber (s), pigment(s), dye(s), matting agent(s), flame-retardant(s), filler(s), catalyst(s) (e.g., tin or bismuth catalysts), non-reactive and/or light-reactive diluent(s), or any combination combination thereof.

"ABPU" or "reactive blocked polyurethane" as used herein refers to UV-curable, (meth)acrylate blocked, polyurethane/polyurea compounds having blocked isocyanate groups such as, for example, those described in U.S. Pat. Nos. 9,453,142 and 9,598,606.

Photoinitiators useful in the compositions of the present invention include both type I and type 2 photoinitiators. In some embodiments, the photoinitiator is a free radical initiator. Examples of photoinitiators include, but are not limited to, diphenyl(2,4,6-trimethylbenzoyl)phosphine oxide (TPO), phenylbis(2,4,6-trimethylbenzoyl)phosphine oxide (PPO), 2-isopropylthioxanthone and/or 4-isopropylthioxanthone (ITX), 4-methoxyphenol (also known as monomethyl ether hydroquinone (MEHQ), or mequinol), 4-ethoxyphenol, 4-propoxyphenol, 4-butoxyphenol 4-heptoxyphenol, 2,6-di-tert-butyl-4-methylphenol (see, e.g., U.S. Pat. No. 9,796,693), phenothiazine (PTZ), ethyl (2,4,6-trimethylbenzoyl) phenyl phosphinate, camphorquinone, Bis(η5-cyclopentadienyl)-bis(2,6-difluoro-3-[pyrrol-1-yl]-phenyl)titanium, substituted acyl-phophine oxide such as Speedcure XKm, 2,4-diethyl-9H-thioxanthen-9-one (DETX). Examples of type II photoinitiators include, but are not limited to, ethyl-4-(dimethylamino)benzoate and 2-ethylhexyl-4-(dimethylamino)benzoate with amine synergists. Polymeric initiators may also be used including, e.g., polymeric TPO, polymeric thioxanthone, or polymeric amine synergists.

In some embodiments, the composition comprising a reactive blocked preopolymer contains not more than 1000 ppm of polyisocyanate oligomer in unblocked form. In other embodiments, the composition comprising a reactive blocked prepolymer contains at least 1000 ppm of polyisocyanate oligomer in unblocked form, and in some embodiments, up to 50% (e.g., 10%, 15%, 20%, 25%, 30%, 35%, 40%, 45%, or 50%, or any concentration range defined therebetween) of said polyisocyanate oligomer remains in unblocked form, if desirable for the final mechanical properties. For example, minimizing the amount of blocking agent may improve resiliency, although inclusion of some amount blocking agent may aid in printability in some embodiments.

In some embodiments, the composition comprising a reactive blocked prepolymer contains not more than 1% by weight of monomeric diisocyanate.

Diluents. Diluents are known in the art as compounds used to reduce the viscosity in a resin composition and may be light reactive/photopolymerizable or non-reactive diluents. Reactive diluents undergo reaction to become part of the polymeric network during UV/light cure. In some embodiments, the reactive diluent may react at approximately the same rate as other reactive monomers and/or prepolymers in the composition. Light reactive diluents include, but are not limited to, monomeric and polymeric acrylate and methacrylate diluents including, for example, poly(ethylene glycol) dimethacrylate, isobornyl methacrylate, lauryl methacrylate, trimethylolpropane trimethacrylate, acrylate analogs thereof, and combinations thereof. Non-reactive diluents include, but are not limited to, aprotic solvents (no hydroxyl or amine functionality), including glycol ether/acetates (e.g., propylene glycol diacetate, propylene glycol methyl ether acetate, propylene glycol dimethyl ether, di(propylene glycol) methyl ether acetate, di(propylene glycol) dimethyl ether, ethylene glycol monobutyl ether acetate, and the like) alkanes (e.g., hexanes, cyclohexane, octane, decane, dodecane, and the like), ethers (e.g., diethyl ether, dibutyl ether, and the like), esters (e.g., butyl acetate, hexyl acetate, octyl acetate, decyl acetate, dodecyl acetate, and the like), aromatics (e.g., toluene, xylene, mineral spirits, white spirits, and the like) and acetonitrile, dimethyl sulfoxide, dimethyl formamide, N-methyl pyrrolidone, tetrahydrofuran, and the like. In some embodiments, the non-reactive diluent includes a urethane grade solvent such as urethane grade (less than 0.05 wt % water) butyl acetate, n-butyl proprionate, diethylene glycol monomethyl acetate, ethylene glycol monobutyl ether acetate, ethyl 3-ethoxypropionate solvent, ethyl acetate, 2-ethylhexyl acetate, isobutyl, isobutyl isobutyrate, isopropyl acetate, methyl acetate, methyl n-amyl ketone, methyl isoamyl ketone, methyl propyl ketone, propylene glycol monomethyl ether acetate, propyl acetate, n-propyl propionate, and combinations of any of the foregoing.

Fillers. Any suitable filler may be used in connection with the present invention, depending on the properties desired in the part or object to be made. Thus, fillers may be solid or liquid, organic or inorganic, and may include reactive and non-reactive rubbers including siloxanes, acrylonitrile-butadiene rubbers: reactive and non-reactive thermoplastics (including but not limited to poly(ether imides), maleimide-styrene terpolymers, polyarylates, polysulfones and polyethersulfones, inorganic fillers such as silicates (such as talc, clays, silica, mica), glass, carbon nanotubes, graphene, cellulose nanocrystals, and the like, including combinations of any of the foregoing. Suitable fillers also include tougheners, such as core-shell rubbers, as discussed below:

Tougheners. One or more polymeric and/or inorganic tougheners can be used as a filler in the present invention. In some embodiments, the toughener may be uniformly distributed in the form of particles in the cured product. In some embodiments, the toughener particles are less than 5 microns (μm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization. Examples of block copolymers include the copolymers whose composition is described in U.S. Pat. No. 6,894,113 (Court et al., Atofina, 2005) and include "NANOSTRENGTH®" SBM (polystyrene-polybutadiene-polymethacrylate), and AMA (polymethacrylate-poly butylacrylate-polymethacrylate), both produced by Arkema (King of Prussia, Pennsylvania).

Other suitable block copolymers include FORTEGRA® and the amphiphilic block copolymers described in U.S. Pat. No. 7,820,760, assigned to The Dow Chemical Company. Examples of known core-shell particles include the core-shell (dendrimer) particles whose compositions are described in U.S. Publication No. 2010/0280151A1, including an amine-branched polymer as a shell grafted to a core polymer polymerized from polymerizable monomers containing unsaturated carbon-carbon bonds: core-shell rubber particles whose compositions are described in EP 1632533A1 and EP 2123711A1 by Kaneka Corporation: and the "KaneAce MX" product line of such particle/epoxy blends whose particles have a polymeric core polymerized from polymerizable monomers such as butadiene, styrene, other unsaturated carbon-carbon bond monomers, or their combinations, and a polymeric shell compatible with the epoxy, typically polymethylmethacrylate, polyglycidylmethacrylate, polyacrylonitrile or similar polymers.

Also suitable as block copolymers in the present invention are the "JSR SX" series of carboxylated polystyrene/polydivinylbenzenes produced by JSR Corporation: "Kureha Paraloid" EXL-2655 (produced by Kureha Chemical Industry Co., Ltd.), which is a butadiene alkyl methacrylate styrene copolymer: "Stafiloid" AC-3355 and TR-2122 (both produced by Takeda Chemical Industries, Ltd.), each of which is an acrylate methacrylate copolymer: and "PARALOID" EXL-2611 and EXL-3387 (both produced by Rohm & Haas), each of which is a butyl acrylate methyl methacrylate copolymer. Examples of suitable oxide particles include NANOPOX® produced by nanoresins AG, a blend of functionalized nanosilica particles and an epoxy.

Core-shell rubbers. Core-shell rubbers are particulate materials (particles) having a rubbery core. Such materials are known and described in, for example, U.S. Patent Application Publication Nos. 20150184039 and 2015/0240113, and U.S. Pat. Nos. 6,861,475, 7,625,977, 7,642,316, 8,088,245.

In some embodiments, the core-shell rubber particles are nanoparticles (i.e., having an average particle size of less than 1000 nanometers (nm)). Generally, the average particle size of the core-shell rubber nanoparticles is less than 500 nm, e.g., less than 300 nm, less than 200 nm, less than 100 nm, or even less than 50 nm. Typically, such particles are spherical, so the particle size is the diameter: however, if the particles are not spherical, the particle size is defined as the longest dimension of the particle.

In some embodiments, the rubbery core of the core-shell rubber can have a glass transition temperature (Tg) of less than −25° C., more preferably less than −50° C., and even more preferably less than −70° C. The Tg of the rubbery core may be well below −100° C. The core-shell rubber also has at least one shell portion that preferably has a Tg of at least 50° C. By "core," it is meant an internal portion of the core-shell rubber. The core may form the center of the core-shell particle, or an internal shell or domain of the core-shell rubber. A shell is a portion of the core-shell rubber that is exterior to the rubbery core. The shell portion (or portions) typically forms the outermost portion of the core-shell rubber particle. The shell material can be grafted onto the core or is cross-linked. The rubbery core may constitute from 50 to 95%, or from 60 to 90%, of the weight of the core-shell rubber particle.

The core of the core-shell rubber may be a polymer or copolymer of a conjugated diene such as butadiene, or a lower alkyl acrylate such as n-butyl-, ethyl-, isobutyl- or 2-ethylhexylacrylate. The core polymer may in addition contain up to 20% by weight of other copolymerized monounsaturated monomers such as styrene, vinyl acetate, vinyl chloride, methyl methacrylate, and the like. The core polymer is optionally cross-linked. The core polymer optionally contains up to 5% of a copolymerized graft-linking monomer having two or more sites of unsaturation of unequal reactivity, such as diallyl maleate, monoallyl fumarate, allyl methacrylate, and the like, wherein at least one of the reactive sites is non-conjugated.

The core polymer may also be a silicone rubber. These materials often have glass transition temperatures below −100° C. Core-shell rubbers having a silicone rubber core include those commercially available from Wacker Chemie, Munich, Germany, under the trade name GENIOPERL®.

The shell polymer, which is optionally chemically grafted or cross-linked to the rubber core, can be polymerized from at least one lower alkyl methacrylate such as methyl methacrylate, ethyl methacrylate or t-butyl methacrylate. Homopolymers of such methacrylate monomers can be used. Further, up to 40% by weight of the shell polymer can be formed from other monovinylidene monomers such as styrene, vinyl acetate, vinyl chloride, methyl acrylate, ethyl acrylate, butyl acrylate, and the like. The molecular weight of the grafted shell polymer can be between 20,000 and 500,000.

One suitable type of core-shell rubber has reactive groups in the shell polymer which can react with an epoxy resin or an epoxy resin hardener. For example, glycidyl groups are suitable. These can be provided by monomers such as glycidyl methacrylate.

One example of a suitable core-shell rubber is of the type described in U.S. Patent Application Publication No. 2007/0027233 (EP 1632533 A1). Core-shell rubber particles as described therein include a cross-linked rubber core, in most cases being a cross-linked copolymer of butadiene, and a shell which is preferably a copolymer of styrene, methyl methacrylate, glycidyl methacrylate and optionally acrylonitrile. The core-shell rubber is preferably dispersed in a polymer or an epoxy resin.

Suitable core-shell rubbers include, but are not limited to, those sold by Kaneka Corporation under the designation Kaneka Kane Ace, including the Kaneka Kane Ace 15 and 120 series of products, including Kaneka Kane Ace MX 120, Kaneka Kane Ace MX 153, Kaneka Kane Ace MX 154, Kaneka Kane Ace MX 156, Kaneka Kane Ace MX170), Kaneka Kane Ace MX 257 and Kaneka Kane Ace MX 120 core-shell rubber dispersions, and mixtures of two or more thereof.

Additional resin ingredients. The composition comprising the reactive blocked prepolymer, the first precursor composition, and/or the second precursor composition can have solid particles suspended or dispersed therein. Any suitable solid particle can be used, depending upon the end product being fabricated. The particles can be metallic, organic/polymeric, inorganic, or composites or mixtures thereof. The particles can be nonconductive, semi-conductive, or conductive (including metallic and non-metallic or polymer conductors): and the particles can be magnetic, ferromagnetic, paramagnetic, or nonmagnetic. The particles can be of any suitable shape, including spherical, elliptical, cylindrical, etc. The particles can be of any suitable size (for example, ranging from 1 nm to 20 μm average diameter). The particles can comprise an active agent or detectable compound, though these may also be provided dissolved or solubilized in a composition. For example, magnetic or paramagnetic particles or nanoparticles can be employed.

The liquid resin can have additional ingredients solubilized therein, including pigments, dyes, catalysts, active compounds or pharmaceutical compounds, detectable compounds (e.g., fluorescent, phosphorescent, radioactive), etc., depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Photoabsorbers. In some embodiments, a composition of the present invention includes a non-reactive pigment or dye that absorbs light, particularly UV light. Suitable examples of such light absorbers include, but are not limited to: (i) titanium dioxide (e.g., included in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a hydroxybenzophenone, hydroxyphenylbenzotriazole, oxanilide, benzophenone, thioxanthone, hydroxyphenyltriazine, and/or benzotriazole ultraviolet light absorber (e.g., Mayzo BLS1326) (e.g., included in an amount of 0.001 or 0.005 to 1, 2 or 4 percent by weight). Examples of suitable organic ultraviolet light absorbers include, but are not limited to, those described in U.S. Pat. Nos. 3,213,058, 6,916,867, 7,157,586, and 7,695,643.

Flame retardants. Flame retardants may be included in some compositions of the present invention. Such flame retardance may include monomers and/or prepolymers that include flame retardant group(s). For example, in some embodiments the constituents may be brominated, i.e., contain one, two, three, four or more bromine groups (—Br) covalently coupled thereto (e.g., with total bromine groups in an amount of from 1, 2, or 5% to 15 or 20% by weight of the polymerizable liquid). Flame retardant oligomers, which may be reactive or non-reactive, may also be included in the resins of the present invention. Examples include, but are not limited to, brominated oligomers such as ICL Flame Retardant F-3100, F-3020, F-2400, F-2016, etc. (ICL Industrial Products). See also U.S. Publication No. 2013/0032375 to Pierre et al. Flame retardant synergists, which when combined with halogens such as bromine synergize flame retardant properties, may also be included. Examples include, but are not limited to, antimony synergists such as antimony oxides (e.g., antimony trioxide, antimony pentaoxide, etc.), aromatic amines such as melamine, etc. See, e.g., U.S. Pat. No. 9,782,947. In some embodiments, the resin composition may contain synergists in an amount of from 0.1, 0.5 or 1% to 3, 4, or 5% by weight. In some embodiments, an antimony pentoxide functionalized with triethanolamine or ethoxylated amine may be used, which is available as a BurnEX® colloidal additive such as BurnEX®: A1582, BurnEX®: ADP480, and BurnEX®: ADP494 (Nyacol® Nano Technologies, Ashland, Massachussetts).

Matting agents. Examples of suitable matting agents include, but are not limited to, barium sulfate, magnesium silicate, silicon dioxide, an alumino silicate, alkali alumino silicate ceramic microspheres, alumino silicate glass microspheres or flakes, polymeric wax additives (such as polyolefin waxes in combination with the salt of an organic anion), and the like, including combinations thereof.

2. Methods of Making Blocked Prepolymers

In the present invention, continuous feed, rather than batch, mixing processes are employed to produce reactive blocked prepolymers such as ABPUs, and in some embodiments, at high rates, with reduced discoloration, and/or with controlled inhibitor levels.

To form the reactive blocked prepolymer, a first precursor composition and a second precursor composition may be provided, the first precursor composition comprising, consisting essentially of, or consisting of a polyisocyanate oligomer, and the second precursor composition comprising an amine (meth)acrylate. The first precursor composition and second precursor composition may be mixed at a temperature of from 0 or 10° C. to 30, 40, 50, 60, 70, or 80° C., to produce said composition comprising a reactive blocked prepolymer.

"Continuously mixing" as used herein refers to a mixing step carried out with a continuous mixer. "Continuous mixer" as used herein refers to a mixing apparatus into which the ingredients to be mixed are introduced continuously, are mixed as they pass through the mixer, and are then discharged in a continuous operation, as opposed to a "batch mixer." Continuous mixers include both static and dynamic continuous mixers. Dynamic mixers include but are not limited to single screw and twin-screw extruders or mixers. Examples include, but are not limited to, those set forth in U.S. Pat. No. 3,286,992 (AD Little): U.S. Pat. No. 3,945,622 (Beloit): U.S. Pat. No. 5,080,493 (3M): U.S. Pat. No. 5,249,862 (Thera): U.S. Pat. No. 8,651,731 (Sulzer): U.S. Pat. No. 9,656,224 (Sulzer): U.S. Pat. No. 10,549,246 (P&G), U.S. Pat. No. 8,734,609 (Bostik), and variations thereof that will be apparent to those skilled in the art of mixing technology.

In some embodiments, the mixer is a "meter mix dispense" (MMD) apparatus. MMD apparatus are known in the art and are available from a variety of sources, including but not limited to METER MIX® Systems US Inc. and DOPAG (US) Ltd., both of 1445 Jamike Ave, 41018 Erlanger, Kentucky, USA. A typical MMD apparatus comprises two or more constituent feed supplies that feed measured (i.e., metered) amounts of the constituents to be mixed into a mixer, from which the mixed product can be dispensed as needed. The mixer is typically a continuous mixer. The feed supplies are typically pumps, such as positive displacement pumps. Suitable positive displacement pumps include, but are not limited to, reciprocating pumps (such as piston, plunger, and diaphragm pumps), rotary pumps (such as gear, lobe, screw, vane, and cam pumps), and piston and plunger pumps operated in single-stroke mode In some embodiments, the continuous mixer is operatively associated with a temperature controller, which in some embodiments may be used for heating or cooling the composition therein.

In some embodiments, the mixing is carried out under conditions which produce said composition comprising a reactive blocked prepolymer in a time of not more than 6 or 8 hours, for rapid production of the reactive blocked prepolymer. In some embodiments, the total volume of the first precursor composition and the second precursor composition is greater than 5 liters, 8 liters, or 10 liters, although in some embodiments, the total volume of first precursor composition and the second composition is less than 5 liters.

Residence time of the composition in the continuous mixer may in some embodiments be less than 15, 10, 8, 5, 3 or 2 minutes, or even less than 1 minute or 30 seconds, before it enters a container. The residence time may vary dependent on the temperature control mechanisms and/or pressure control of the system.

In some embodiments, a polymerization inhibitor is present in the first and/or second precursor composition (e.g., the second precursor composition). In some embodiments, 10%, 5%, 1% or less of a polymerization inhibitor (e.g., a free radical polymerization inhibitor) is consumed during the production of the reactive blocked prepolymer.

In some embodiments, one of the precursor compositions is heated, and/or the other of said precursor compositions is cooled. For example, the first precursor composition may be heated, e.g., to about 50, 60 or 70° C., and the second precursor composition may be cooled, e.g., to about 25° C. or less. Such heating and/or cooling may be active, such as with a water jacket around a static mixer, or passive, such as cooling with a longer, thinner, static mixer.

In some embodiments, the first precursor composition and said second precursor composition are each filtered before said mixing step (e.g., by positioning a filter in front of said mixer for each precursor composition), to remove dust, particles, and/or other contaminants. Filtering of the precursor compositions is preferable in some embodiments because they are lower viscosity than the resulting prepolymer mixture.

The reactive blocked prepolymer compositions described herein can be used to produce dual cure resins for additive manufacturing. Such resins can be prepared as described in, for example, U.S. Pat. Nos. 9,676,963, 9,453,142 and 9,598,606.

The present invention is explained in greater detail in the following non-limiting Examples.

Example 1

Production of ABPU From Commercial Oligomer

A continuous feed flow of NCO-oligomer ('part A') with TBAEMA ('part B') is used to produce ABPUs at high rates, with low color and controlled inhibitor levels. For example, an NCO-oligomer purchased from a commercial supplier (such as Adiprene products from Lanxess AG), is fed as part A through a mix meter and dispense (MMD) apparatus with TBAEMA (and any other additives needed) as the part B. Suitable is the MMD System 1000 (available from Henkel Corp, One Henkel Way, Rocky Hill, CT 06067 USA). The temperature is easier to control relative to batch systems, and it allows for using lower temperatures with short column lengths, to produce low color and reduced or bubble-free ABPUs at relatively fast speeds without needing large chemical reactors. As fed through such an MMD apparatus, the reaction of the oligomer with the TBAEMA to form a reactive blocked prepolymer, at a temperature of about 25 to 30° C. should in some embodiments be complete in about 15 minutes or less. The resulting reaction product can be fed directly into storage drums, intermediate bulk containers (IBCs, "totes") or the like.

Example 2

Production of ABPU From Oligomer Synthesized De Novo

In another embodiment, the approach described herein provides advantages when the polyisocyanate oligomer is synthesized de novo in a reactor, rather than purchased from a commercial supplier.

For example, when the polyisocyanate oligomer (such as HMDI-PTMO-HMDI) is produced in the reactor at 70° C., it can be easily degassed and filtered while it is at this higher temperature, rather than after it has been mixed with the blocking agent at a reduced temperature. As no methacrylates are present after initial production while at the higher temperature, there is much less potential for discoloration or inhibitor consumption. This is in contrast with prior processes, where the blocked prepolymers are filtered at 35-50° C., a temperature range in which the compounds have much higher viscosities, coupled with the fact that the blocked prepolymers are more viscous than the polyisocyanate prepolymers even when at the same temperature.

Once filtered (typically into a container such as an IBC), the isocyanate prepolymer is then fed through the MMD apparatus with the continuous TBAEMA as described in Example 1 above to form the final reactive blocked prepolymer. By avoiding the need to add the TBAEMA (or other sec-alkyl amino meth(acrylate) or tert-alkyl amino meth (acrylate)) into the reactor, the reactor use time may be reduced significantly, in some embodiments from 16 hours or more, to 4 hours or less.

Example 3

Understanding the Reaction Rate of MEHQ (4-methoxyphenol) in the Presence of Isocyanate With a Tin Catalyst 4-methoxyphenol (MEHQ) is a compound commonly used to inhibit polymerization of acrylates and methacrylates. As such, an inhibitor is commonly present in (meth) acrylate reagents. When synthesizing ABPUs in bulk/conventional methods (i.e., batch reactors), the (meth)acrylates are typically fed into the reactor over time to improve temperature control, which means there is often a significant amount of time when unblocked isocyanate is in the presence of MEHQ. As such, the reaction rate of the MEHQ with an unblocked isocyanate was investigated.

Isophorone diisocyanate (IPDI, 17.850 g) was added to a glass container followed by MEHQ (0.0140 g). The closed mixture was heated to 50° C. for 10 minutes to fully dissolve the solids and represents a theoretical loading of 784 ppm MEHQ, wherein a sample of this was taken for MEHQ quantitative analysis via UPLC (Ultra-performance Liquid Chromatography). A portion of this mixture (15.009 g) was transferred to another clean glass container followed by stannous octoate (0.0056 g, 373 ppm) and the container was shaken to homogenize. A sample was taken for MEHQ quantitative analysis and the closed container was then heated at 50° C. Samples were taken at various time points for MEHQ analysis. The measured MEHQ loadings are shown in Table 1 and FIG. 1.

TABLE 1

Measure MEHQ concentration over time in IPDI at 50° C. with and without tin catalyst.

| CATALYST | TIME AT 50° C. (MIN) | MEHQ (PPM) |
|---|---|---|
| NO | Initial (~0) | 756.7 |
| YES | Initial (~0) | 711.0 |
| YES | 15 | 644.2 |
| YES | 30 | 588.0 |
| YES | 60 | 410.1 |
| YES | 180 | 6.9 |

As can be seen from Table 1 and FIG. 1, in the presence of a tin catalyst at 50° C., the inhibitor concentration decreases over time, suggesting reaction with the IPDI. Based on such a reaction rate, the MEHQ concentration in a batch reactor may be very sensitive to the reaction time and feed rate of the meth(acrylate). As MEHQ is known to be a polymerization inhibitor, the final concentration will directly impact the additive manufacturing process. By using a continuous mixing system (e.g., a MMD apparatus) where the isocyanate would be immediately mixed with all of the meth(acrylate), the MEHQ would be expected to have minimal consumption and thus would result in a more consistent composition for use in additive manufacturing.

Example 4

Demonstration of Color Change With Extended Heating

After an ABPU containing methacrylate diluents was prepared using a batch process, the color was measured using a colorimeter (Hunterlab Colorquest XE), which had an APHA (American Public Health Association) color scale value of 86. The sample was then heated to 50° C. for 48 hours and the color was measured to have an APHA color scale value of 116. As such, as the ABPU is formed, yellowing of the blocked polyisocyanate occurs. This shows that yellowing/coloration of the ABPU color may be very dependent on the temperature and time of heating of its components. In batch reactors, the mixture will typically be heated to lower the viscosity and maintain good mixing. However, the heating time would be expected to be significantly longer (typically hours to days) than compared to a continuous flow (minutes). This would be expected to result in significantly improved color for continuous flow than batch processes as well as much more consistent colors.

The foregoing is illustrative of the present invention and is not to be construed as limiting thereof. The invention is defined by the following claims, with equivalents of the claims to be included therein.

What is claimed is:

1. A method for the production of a composition comprising a reactive blocked prepolymer, the method comprising:

continuously mixing a first precursor composition and a second precursor composition, the first precursor composition consisting essentially of a polyisocyanate oligomer and the second precursor composition comprising an amine (meth) acrylate, at a temperature of from 0° C. to 80° C., to produce said composition comprising a reactive blocked prepolymer, wherein said mixing is carried out under conditions which produce said composition comprising a reactive blocked prepolymer in a time of not more than 8 hours, for production of the reactive blocked prepolymer.

2. The method of claim 1, wherein said continuous mixing step is carried out with a static mixer, a dynamic mixer, a mix meter dispense (MMD) apparatus, or a combination thereof.

3. The method of claim 2, wherein said static mixer, dynamic mixer, mix meter dispense (MMD) apparatus, or combination thereof is operatively associated with a temperature controller.

4. The method of claim 1, wherein said mixing is carried out under conditions which produce said composition comprising a reactive blocked prepolymer in a time of not more than 6 hours.

5. The method of claim 1, wherein the continuous mixing is carried out in a continuous mixer, and wherein a residence time of the composition in the continuous mixer is less than 15 minutes.

6. The method of claim 1, wherein said amine (meth) acrylate is selected from the group consisting of tertiary-butylaminoethyl methacrylate (TBAEMA), tertiary-pentylaminoethyl methacrylate (TPAEMA), tertiary-hexylaminoethyl methacrylate (THAEMA), tertiary-butylaminopropyl methacrylate (TBAPMA), acrylate analogs thereof, and mixtures thereof.

7. The method of claim 1, wherein one of said precursor compositions is heated, and/or the other of said precursor compositions is cooled.

8. The method of claim 1, wherein said first precursor composition includes not more than 1% by weight of monomeric diisocyanate.

9. The method of claim 1, wherein said first precursor composition includes not more than 1000 ppm water.

10. The method of claim 1, wherein said second precursor composition further comprises at least one diluent, at least one polymerization inhibitor, or a combination thereof.

11. The method of claim 1, wherein said composition comprising a reactive blocked prepolymer contains not more than 1000 ppm of polyisocyanate oligomer in unblocked form.

12. The method of claim 1, wherein said composition comprising a reactive blocked prepolymer contains up to 50% of the polyisocyanate oligomer in unblocked form.

13. The method of claim 1, wherein said composition comprising a reactive blocked prepolymer contains not more than 1% by weight of monomeric diisocyanate.

14. The method of claim 1, wherein said first precursor composition and/or said second precursor composition is filtered before said continuous mixing step.

15. The method of claim 1, wherein said second precursor composition further comprises at least one additional constituent selected from the group consisting of a photoabsorber, pigment, dye, catalyst, matting agent, flame-retardant, filler, non-reactive and light-reactive diluent, and a combination thereof.

16. The method of claim 15, wherein said light reactive diluent is present and comprises poly (ethylene glycol) dimethacrylate, isobornyl methacrylate, lauryl methacrylate, trimethylolpropane trimethacrylate, an acrylate analog thereof, or a combination of any thereof.

17. The method of claim 1, wherein the first and/or second precursor composition comprises a polymerization inhibitor and 10% or less of the polymerization inhibitor is consumed during the production of the reactive blocked prepolymer.

18. The method of claim 1, wherein the continuously mixing is carried out at a temperature of from 10° C. to 60° C.

19. The method of claim 1, wherein said mixing is carried out under conditions which produce said composition comprising a reactive blocked prepolymer in a time of not more than 4 hours.

20. The method of claim 1, wherein the continuous mixing is carried out in a continuous mixer, and wherein a residence time of the composition in the continuous mixer is less than 5 minutes.

* * * * *